(12) United States Patent
Sanders et al.

(10) Patent No.: US 10,973,106 B2
(45) Date of Patent: Apr. 6, 2021

(54) SYSTEMS AND METHODS OF DIRECTING A LIGHTING FIXTURE IN A VENUE

(71) Applicant: Electronic Theatre Controls, Inc., Middleton, WI (US)

(72) Inventors: Chelsea Sanders, Middleton, WI (US); Christopher Mizerak, Oceanside, CA (US); Dan Duffy, Middleton, WI (US); Matt Halberstadt, Middleton, WI (US)

(73) Assignee: Electronic Theatre Controls, Inc., Middleton, WI (US)

(*) Notice: Subject to any disclaimer, the term of this patent is extended or adjusted under 35 U.S.C. 154(b) by 0 days.

(21) Appl. No.: 16/708,759

(22) Filed: Dec. 10, 2019

(65) Prior Publication Data
US 2020/0187333 A1    Jun. 11, 2020

Related U.S. Application Data

(60) Provisional application No. 62/777,466, filed on Dec. 10, 2018.

(51) Int. Cl.
*H05B 47/155* (2020.01)
*F21V 21/15* (2006.01)
(Continued)

(52) U.S. Cl.
CPC ........... *H05B 47/155* (2020.01); *F21V 14/02* (2013.01); *F21V 21/15* (2013.01); *G06F 30/12* (2020.01);
(Continued)

(58) Field of Classification Search
CPC ....... F21V 14/02; F21V 21/15; H04N 5/2256; G06F 30/12; G06F 30/13; H05B 47/19; H05B 47/155
See application file for complete search history.

(56) References Cited

U.S. PATENT DOCUMENTS

| 5,307,295 A | 4/1994 | Taylor et al. |
| 5,406,176 A | 4/1995 | Sugden |

(Continued)

FOREIGN PATENT DOCUMENTS

| WO | 2017042027 A1 | 3/2017 |
| WO | 2017148768 A1 | 9/2017 |

OTHER PUBLICATIONS

Combined Search Report and Examination Report issued by the United Kingdom Intellectual Property Office for Application No. 1918096.7 dated Jun. 2, 2020 (5 pages).

(Continued)

*Primary Examiner* — Amy Cohen Johnson
*Assistant Examiner* — Syed M Kaiser
(74) *Attorney, Agent, or Firm* — Michael Best and Friedrich LLP

(57) ABSTRACT

Methods and systems are provided for directing a lighting fixture in a venue. A user device is paired with a three-dimensional model space that represents a physical space of the venue. A lighting beam destination is indicated with the user device using a position and an orientation of the user device. The indicated lighting beam destination is converted into coordinates in the three-dimensional model space. A lighting fixture orientation value to direct a lighting beam of the lighting fixture to the lighting beam destination in the physical space of the venue is determined based on the coordinates of the lighting beam destination in the three-dimensional model space of the venue. A motor associated with the lighting fixture is actuated to move the lighting fixture to a lighting fixture orientation in the physical space of the venue based on the lighting fixture orientation values.

22 Claims, 12 Drawing Sheets

(51) Int. Cl.
*F21V 14/02* (2006.01)
*G06F 30/12* (2020.01)
*H05B 47/19* (2020.01)
*H04N 5/225* (2006.01)
*G06F 30/13* (2020.01)

(52) U.S. Cl.
CPC ........... *G06F 30/13* (2020.01); *H04N 5/2256* (2013.01); *H05B 47/19* (2020.01)

(56) References Cited

U.S. PATENT DOCUMENTS

| | | | |
|---|---|---|---|
| 5,969,485 A | 10/1999 | Hunt | |
| 7,242,152 B2 | 7/2007 | Dowling et al. | |
| 7,306,341 B2 | 12/2007 | Chang | |
| 7,401,934 B2 | 7/2008 | Hunt | |
| 7,502,034 B2 | 3/2009 | Chemel et al. | |
| 8,324,826 B2 | 12/2012 | Verberkt et al. | |
| 8,917,905 B1* | 12/2014 | Dill | G06K 9/00362 382/103 |
| 8,938,468 B2 | 1/2015 | Morgan et al. | |
| 9,167,672 B2 | 10/2015 | Engelen et al. | |
| 9,400,856 B2 | 7/2016 | Striegel | |
| 9,677,755 B1* | 6/2017 | Linnell | F21V 33/0052 |
| 10,292,246 B2* | 5/2019 | Rajagopalan | H05B 47/155 |
| 10,375,789 B2* | 8/2019 | Bosua | H05B 45/10 |
| 10,465,882 B2* | 11/2019 | Engelen | H05B 45/10 |
| 10,656,813 B1* | 5/2020 | Hole | G06F 3/0482 |
| 2004/0252486 A1 | 12/2004 | Krause | |
| 2005/0275626 A1 | 12/2005 | Mueller et al. | |
| 2007/0285514 A1* | 12/2007 | Perlman | H04N 5/2353 348/169 |
| 2009/0105856 A1 | 4/2009 | Kurt et al. | |
| 2010/0303297 A1* | 12/2010 | Mikhailov | G06T 7/11 382/103 |
| 2011/0035404 A1 | 2/2011 | Morgan et al. | |
| 2014/0095122 A1* | 4/2014 | Appleman | G06F 30/13 703/1 |
| 2015/0035437 A1* | 2/2015 | Panopoulos | F21V 14/02 315/112 |
| 2015/0084514 A1* | 3/2015 | Anthony | H05B 47/155 315/131 |
| 2015/0186559 A1* | 7/2015 | Schmidt | G06F 3/00 345/419 |
| 2015/0331969 A1* | 11/2015 | Dahlen | G06F 30/00 703/1 |
| 2017/0234562 A1* | 8/2017 | Ribbich | G05D 23/1923 700/277 |
| 2017/0238401 A1* | 8/2017 | Sadwick | F21V 21/15 315/294 |
| 2018/0160507 A1* | 6/2018 | Feeney | H05B 47/155 |
| 2018/0216791 A1* | 8/2018 | Leung | F21K 9/61 |
| 2019/0013960 A1* | 1/2019 | Sadwick | H05B 47/10 |
| 2019/0141291 A1* | 5/2019 | Mcnelley | H04N 9/3194 |
| 2019/0364642 A1* | 11/2019 | Feeney | G06F 3/0304 |

OTHER PUBLICATIONS

Non Patent Literature, "Articulated Structure and Its Kinematic Chain From Motion with Extension to Non-Rigid Parts", website: http://people.inf.ethz.ch/pomarc/pubs/YanAMDO06subm.pdf, webpage available at least as early as Sep. 17, 2018.

Koen Buys (KU Leuven) "People Pose Detection" May 10, 2013, 35 page presentation.

Buys, et al., "An adaptable system for RGB-D based human body detection and pose estimation" Journal of Visual Communication and Image Representation, Jan. 2014, webpage: https://dl.acm.org/doi/10.1016/j.jvcir.2013.03.011.

Wandt, et al. "A Kinematic Chain Space for Monocular Motion Capture", webpage: https://arxiv.org/pdf/1702.00186.pdf, Feb. 2, 2017.

Lin, et al, "A Vision-based Scheme for Kinematic Model Construction of Re-configurable Modular Robots", webpage: https://arxiv.org/pdf/1703.03941.pdf, Mar. 11, 2017.

Non Patent Literature, Wang, et al., "Designing an Adaptive Lighting Control System for Smart Buildings and Homes", Arizona State University, Apr. 2015.

\* cited by examiner

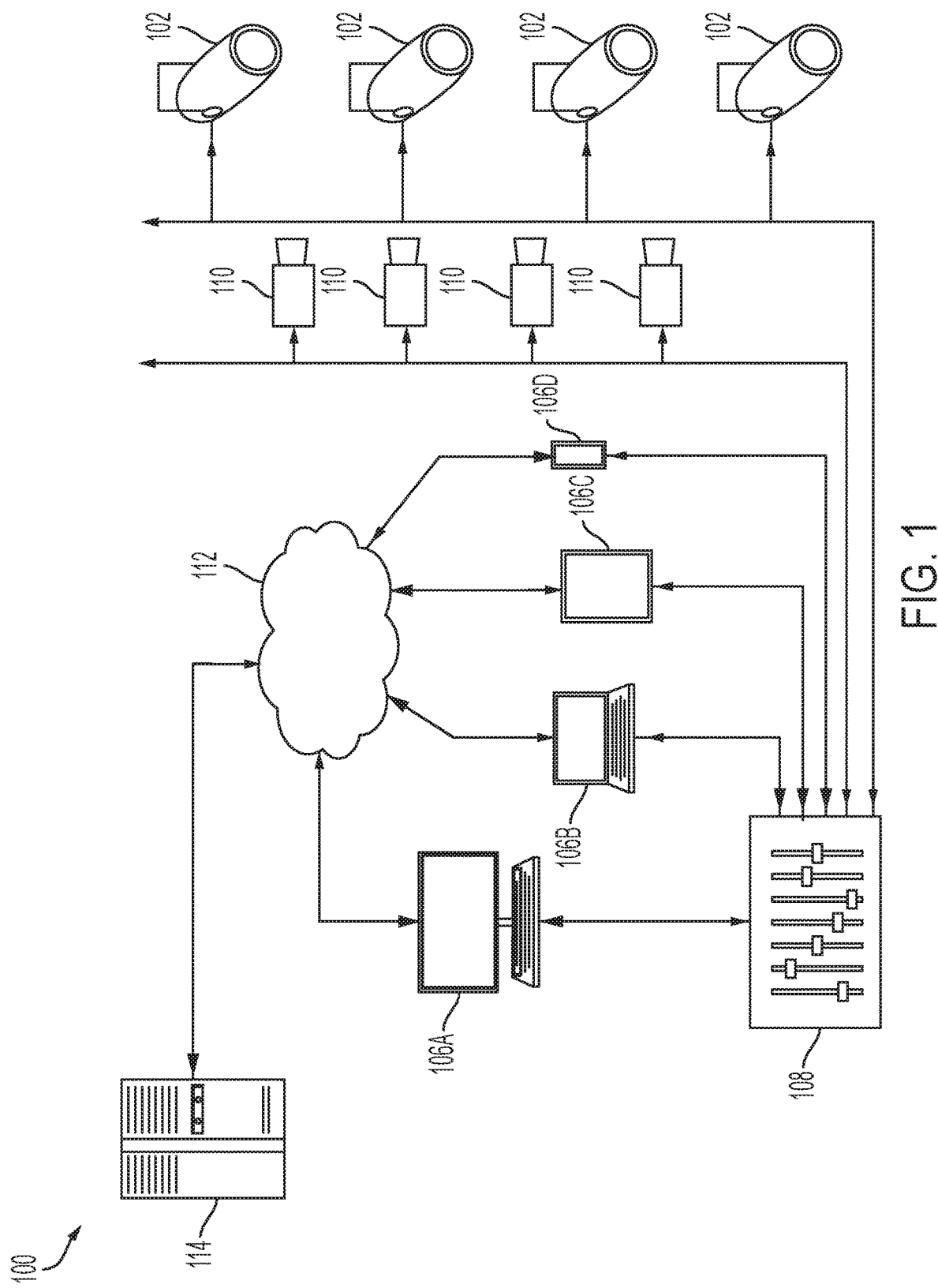

400

| RESET | Ch# 001 | IP 1 |

Position 1                  ACTIVE
0.000           0.000

Position 2                  EDIT
0.000           3.415

Position 3                  EDIT
3.010           0.000

Position 4                  EDIT
3.010           3.415

Pan/Tilt1   69.996   31.883    Pan/Tilt2   76.317   43.242
Pan/Tilt3   49.570   37.575    Pan/Tilt4   60.830   46.442

| PAN+ | PAN- | TILT+ | TILT- |

CALCULATE    -1.600156    -5.887439    11.087051
                -2.848069    -2.263623    -88.714897

FIG. 4

SYSTEMS AND METHODS OF DIRECTING A LIGHTING FIXTURE IN A VENUE

CROSS-REFERENCE TO RELATED APPLICATIONS

This application claims the benefit of U.S. Provisional Patent Application No. 62/777,466, filed on Dec. 10, 2018, which is hereby incorporated by reference in its entirety.

FIELD

Embodiments described herein relate to directing or controlling a lighting fixture in a venue.

SUMMARY

Systems and methods described herein relate to rendering lighting visuals in a virtual reality or augmented reality interactive environment as a way to allow a user to experiment with and discover the lighting visuals (e.g., a light beam, a lighting transition, a follow spot, etc.) available for a given venue and/or lighting fixture arrangement. Three-dimensional models of the potential locations of lighting beams for given lighting fixtures are created and made available in the interactive environment. These models include three-dimensional representations of lighting beams and other lighting visuals, or the models can be used as a three-dimensional model space bounding the possible lighting beam destinations for a given lighting fixture in the real world. In some embodiments, the user directs one or more lighting fixtures with the aid of a user device by indicating a desired lighting beam destination.

One component of accurately rendering and controlling lighting visuals in an interactive environment is having accurate information regarding the lighting fixtures. Particularly, the arrangement information (e.g., the position and orientation) of each lighting fixture should be known with accuracy. For example, one inch of discrepancy between the position data and the real-world position of the lighting fixture can cause the projected lighting beam to be multiple feet away from the intended lighting beam destination. Similarly, a discrepancy of a few degrees between the orientation data and the real-world orientation of the lighting fixture can cause a similar inconsistency.

Currently, a user must make precise measurements to accurately determine the position of a lighting fixture. To determine orientation, the user must also have specific knowledge of the lighting fixture and its current hanging position. Because lighting fixtures can be mounted to rafters, scaffolding, pipes, or any other structure in any number of ways, this technique requires significant time and effort to complete. Additionally, the user must be experienced and/or technically trained in order to properly use the measurement tools and techniques. A specialized technician is often required. Also, these techniques are prone to human error, which can only be detected when a user attempts to control the one or more lighting fixtures according to a desired lighting visual. Once the discrepancy is discovered, which can be at a late hour in the setup process at a venue, the user must perform the entire measurement process again for the incorrectly calibrated light. If a specialized technician was contracted, the same or another specialized technician may need to perform the process on short notice. Because the time of the event at the venue often has a firm deadline, this process can be stressful, inconvenient, and expensive.

Also currently, directing and focusing a light on a specific location in a venue requires a lighting programmer to adjust the lighting fixture's pan and tilt until the correct location of the lighting beam is achieved. This process requires a skilled user and can be time consuming due to the large number of lights at many venues. An example of the time and effort involved includes setting up one or more focus palettes. Focus palettes are used in lighting design to define a specific set of positions upon which multiple moving lighting fixtures focus. Creating and updating focus palettes can be very monotonous and can take a considerable amount of time. For example, a touring band will tour with hundreds of moving lighting fixtures and the show will require focus palettes for each band member's multiple positions on stage throughout the show. At each new venue of the tour, every moving lighting fixture must be moved and focused for at least one of the focus palettes. This setup process takes significant time during setup, which can be stressful for the user, expensive, and prone to human errors.

To address the above concerns, embodiments described herein provide systems and methods for determining the arrangement information of a lighting fixture. Embodiments described herein determine the pertinent details about a lighting fixture's arrangement information (e.g., location, mounting style, etc.) without requiring expensive measuring tools, expert knowledge, or a significant amount of time.

Systems and methods are described herein for directing a lighting fixture in a venue. Embodiments described herein greatly reduce the amount of time to set up and adjust lighting fixtures for tasks, such as creating focus palettes and following a mark on a stage, without requiring expert knowledge.

Methods are described herein for directing a lighting fixture in a venue. The method includes pairing a user device with a three-dimensional model space that represents a physical space of the venue. A lighting beam destination in the physical space of the venue is indicated with the user device using a position and orientation of the user device. An electronic processor converts the indicated lighting beam destination into coordinates in the three-dimensional model space. The electronic processor determines a lighting fixture orientation value to direct a lighting beam of the lighting fixture to the lighting beam destination in the physical space of the venue based on the coordinates of the lighting beam destination in the three-dimensional model space. The electronic processor controls actuation of a motor associated with the lighting fixture to move the lighting fixture to a corresponding lighting fixture orientation in the physical space of the venue based on the lighting fixture orientation value.

In some embodiments, the user device is associated with at least one camera. The indicating, with the user device, the lighting beam destination in the physical space of the venue using the position and the orientation of the user device includes indicating the lighting beam destination relative to a capture view of the at least one camera.

In some embodiments, the user device is associated with at least one camera. The pairing of the user device in the venue with the three-dimensional model space that represents the physical space of the venue includes using a capture view of the at least one camera to determine the position and the orientation of the user device.

In some embodiments, the pairing of the user device in the venue with the three-dimensional model space that represents the physical space of the venue includes detecting a reference point in the venue with the at least one camera associated with the user device.

In some embodiments, the user device displays an augmented reality image of the venue based on the capture view of the at least one camera.

In some embodiments, the indicating of the lighting beam destination in the physical space of the venue using the position and the orientation of the user device includes designating a location on a surface of the venue where an area of the capture view of the camera meets the surface as the lighting beam destination.

In some embodiments, the controlling of actuation of the motor associated with the lighting fixture to move the lighting fixture to the lighting fixture orientation in the physical space of the venue based on the orientation values includes controlling, with the electronic processor, movement of the lighting fixture to follow the lighting beam destination as the capture view of the camera changes.

In some embodiments, the indicating of the lighting beam destination in the physical space of the venue using the position and the orientation of the user device includes detecting, by the electronic processor, a pointing direction of an end of the user device in a lighting beam destination direction in the physical space while the user device is paired with the three-dimensional model space.

In some embodiments, at least one camera is associated with the user device such that a capture view of the camera faces a direction perpendicular to the pointing direction of the end of the user device.

In some embodiments, the controlling of the actuation of the motor associated with the lighting fixture to move the lighting fixture to the corresponding lighting fixture orientation includes controlling, with the electronic processor, movement of the lighting fixture to follow the lighting beam destination as the capture view of the camera changes.

Systems are described herein for directing a lighting fixture in a venue. The system includes a lighting fixture, a motor associated with the lighting fixture, and a user device. The user device includes a controller that has an electronic processor and a memory. The memory stores instructions that when executed by the electronic processor configure the controller to pair the user device with a three-dimensional model space of a venue that represents a physical space of the venue. The controller indicates a lighting beam destination in the physical space of the venue using a position and an orientation of the user device and converts the indicated lighting beam destination into coordinates in the three-dimensional model space based on the position and orientation of the user device in the physical space of the venue. The controller determines a lighting fixture orientation value to direct a lighting beam of the lighting fixture to the lighting beam destination in the physical space of the venue based on the coordinates of the lighting beam destination in the three-dimensional model space. The controller controls actuation of the motor associated with the lighting fixture to move the lighting fixture to a corresponding lighting fixture orientation in the physical space of the venue based on the lighting fixture orientation value.

In some embodiments, the systems include at least one camera associated with the electronic processor. The controller is further configured to indicate the lighting beam destination relative to a capture view of the at least one camera.

In some embodiments, the systems include at least one camera associated with the electronic processor. The controller is further configured to use a capture view of the at least one camera to determine orientation and position of the user device.

In some embodiments, the controller is further configured to detect a reference point in the venue with the at least one camera associated with the electronic processor.

In some embodiments, the user device displays an augmented reality image of the venue based on the capture view of the at least one camera.

In some embodiments, the controller is further configured to designate a location on a surface of the venue where a point or area of the capture view of the camera meets the surface as the lighting beam destination.

In some embodiments, the controller is further configured to control movement of the lighting fixture to follow the lighting beam destination as the capture view of the camera changes.

In some embodiments, the controller is further configured to detect a pointing direction of an end of the user device in a lighting beam destination direction in the physical space while the user device is paired with the three-dimensional model space.

In some embodiments, at least one camera is associated with the user device such that a capture view of the camera faces a direction perpendicular to the pointing direction of the end of the user device.

In some embodiments, the controller is further configured to control movement of the lighting fixture to follow the lighting beam destination as the capture view of the camera changes.

In some embodiments, the lighting beam destination in the physical space of the venue is designated by receiving a distance and the orientation from the user device.

Before any embodiments are explained in detail, it is to be understood that the embodiments are not limited in its application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software based devices, as well as a plurality of different structural components, may be utilized to implement the embodiments. For example, "servers" and "computing devices" described in the specification can include one or more processing units, one or more computer-readable medium modules, one or more input/output interfaces, and various connections (e.g., a system bus) connecting the components.

Other aspects of the embodiments will become apparent by consideration of the detailed description and accompanying drawings.

BRIEF DESCRIPTION OF THE DRAWINGS

FIG. 1 illustrates a system for determining arrangement information of a lighting fixture.

FIG. 4 illustrates an application interface screen for use with the system of FIG. 1 and/or FIG. 1A for controlling the movement of a lighting fixture according to user input.

DETAILED DESCRIPTION

Figure 1A:
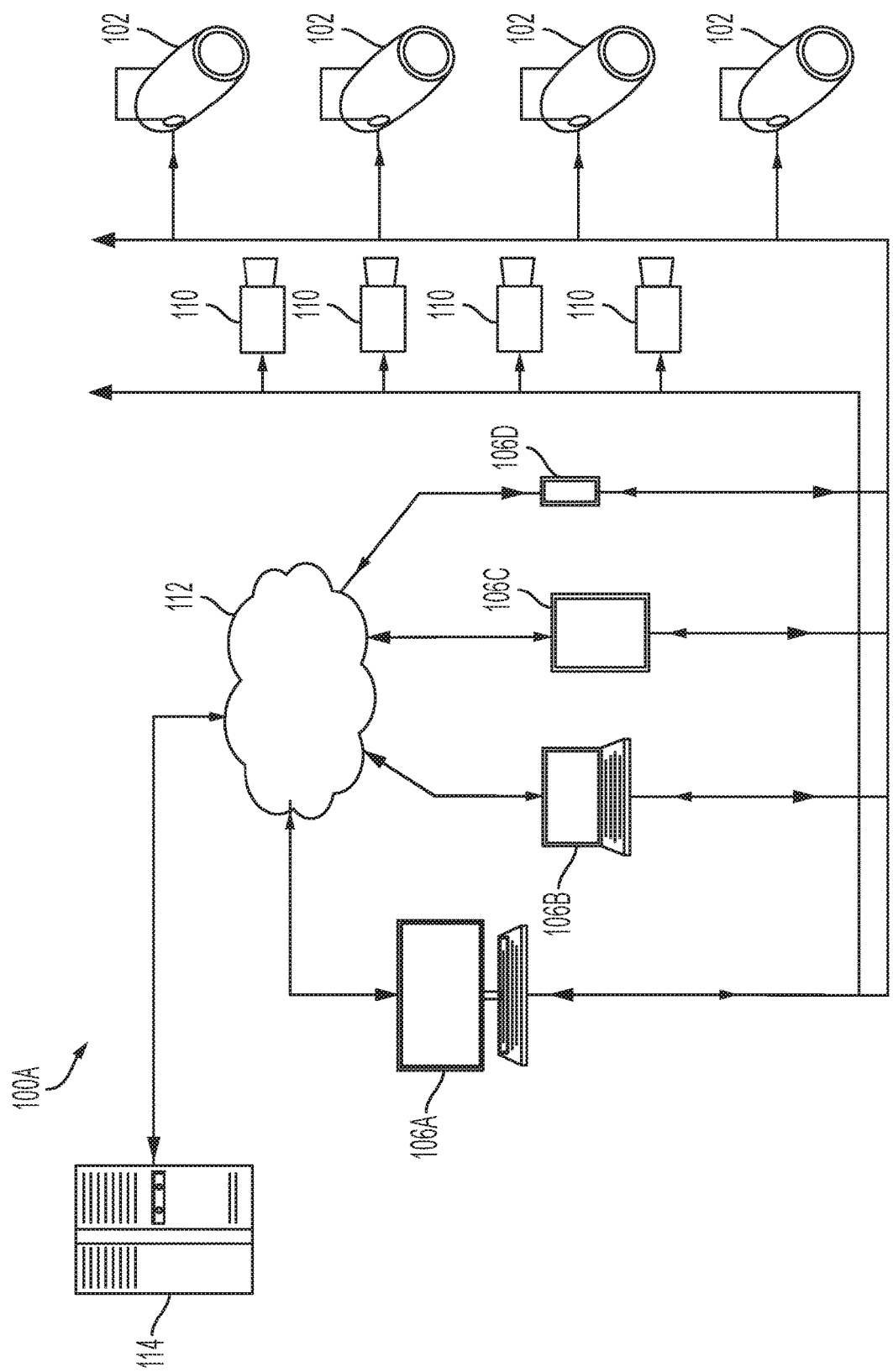
FIG. 1A illustrates another system for determining arrangement information of a lighting fixture.

Embodiments described herein relate to accurately determining arrangement information of one or more lighting fixtures and accurately focusing one or more lighting fixtures on a lighting beam destination. Both of these tasks conventionally require skilled technicians, precise and expensive measuring tools, and significant time. These tasks are achieved by acquiring arrangement information and subsequently controlling lighting fixtures based on the arrangement information.

For example, FIG. 1 illustrates a system 100 for determining arrangement information of one or more lighting fixtures 102 and subsequently directing the one or more lighting fixtures 102 in a venue 104 (shown in FIG. 3). The system 100 includes a user input device 106A-106D, a control board or control panel 108, lighting fixtures 102, cameras 110, a network 112, and a server-side computer or server 114. The user input device 106A-106D includes, for example, a personal or desktop computer 106A, a laptop computer 106B, a tablet computer 106C, or a mobile phone (e.g., a smart phone) 106D. Other user input devices include, for example, an augmented reality headset or glasses. In some embodiments, the cameras 110 are integrated with the user input device 106A-106D, such as the camera of the mobile phone 106D. In other embodiments, the cameras 110 are separate from the user input device 106A-106D.

The user input device 106A-106D is configured to communicatively connect to the server 114 through the network 112 and provide information to, or receive information from, the server 114 related to the control or operation of the system 100. The user input device 106A-106D is also configured to communicatively connect to the control board 108 to provide information to, or receive information from, the control board 108. The connections between the user input device 106A-106D and the control board 108 or network 112 are, for example, wired connections, wireless connections, or a combination of wireless and wired connections. Similarly, the connections between the server 114 and the network 112, the control board 108 and the lighting fixtures 102, or the control board 108 and the cameras 110 are wired connections, wireless connections, or a combination of wireless and wired connections.

The network 112 is, for example, a wide area network ("WAN") (e.g., a TCP/IP based network), a local area network ("LAN"), a neighborhood area network ("NAN"), a home area network ("HAN"), or personal area network ("PAN") employing any of a variety of communications protocols, such as Wi-Fi, Bluetooth, ZigBee, etc. In some implementations, the network 112 is a cellular network, such as, for example, a Global System for Mobile Communications ("GSM") network, a General Packet Radio Service ("GPRS") network, a Code Division Multiple Access ("CDMA") network, an Evolution-Data Optimized ("EV-DO") network, an Enhanced Data Rates for GSM Evolution ("EDGE") network, a 3GSM network, a 4GSM network, a 4G LTE network, a 5G New Radio, a Digital Enhanced Cordless Telecommunications ("DECT") network, a Digital AMPS ("IS-136/TDMA") network, or an Integrated Digital Enhanced Network ("iDEN") network, etc.

FIG. 1A illustrates an alternative system 100A for determining arrangement information of one or more lighting fixtures 102 and subsequently controlling the lighting fixtures 102. The hardware of the alternative system 100A is identical to the above system 100, except the control board or control panel 108 is removed. As such, the user input device 106A-106D is configured to communicatively connect to the lighting fixtures 102 and to the cameras 110. The connections between the user input device 106A-106D and the lighting fixtures 102 and the connections between the user input device 106A-106D and the camera 110 are wired connections, wireless connections, or a combination of wireless and wired connections.

Figure 2:
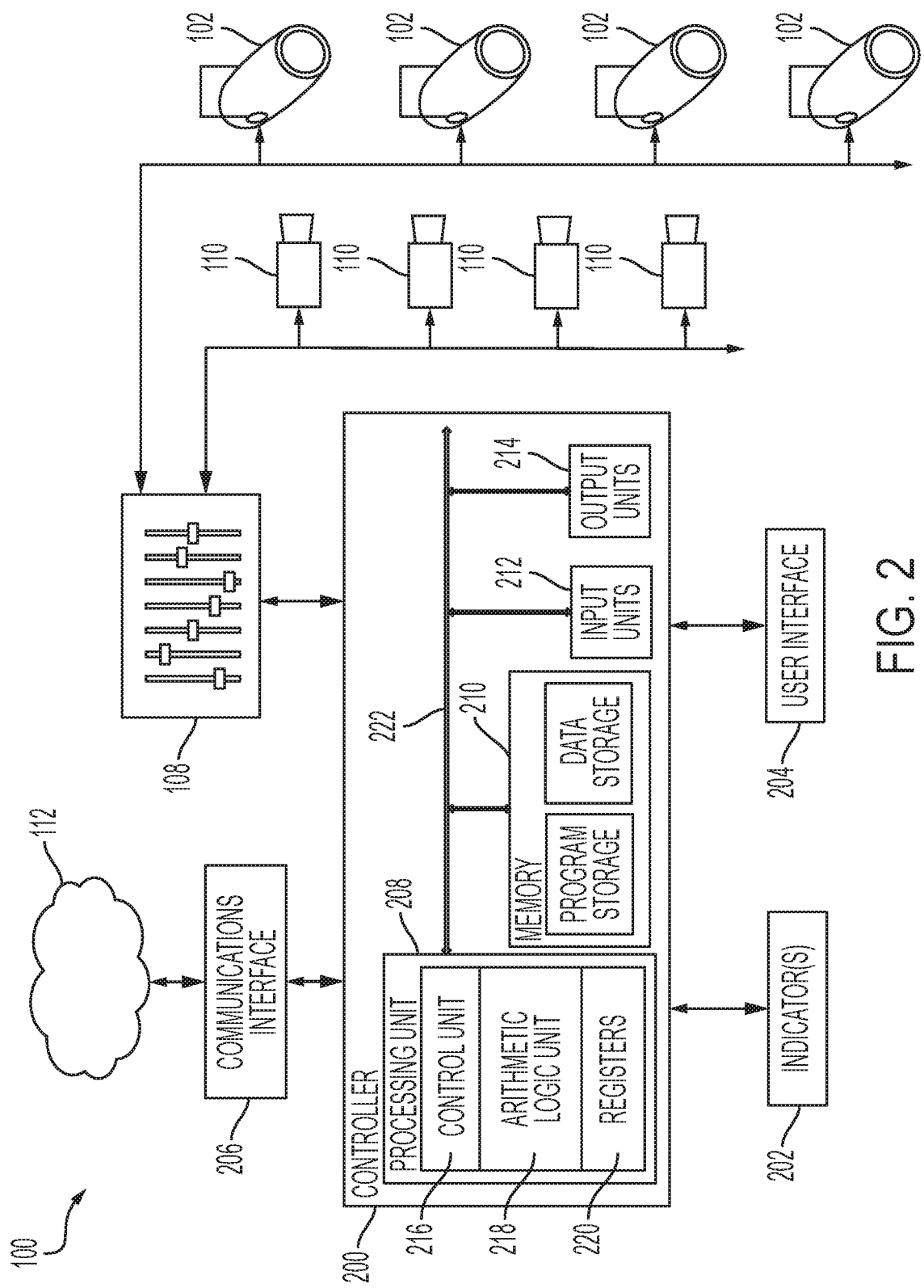
FIG. 2 illustrates a controller for the system of FIG. 1.

FIG. 2 illustrates a controller 200 for the system 100. The controller 200 is electrically and/or communicatively connected to a variety of modules or components of the system 100. For example, the illustrated controller 200 is connected to one or more indicators 202 (e.g., LEDs, a liquid crystal display ["LCD"], etc.), a user input or user interface 204 (e.g., a user interface of the user input device 106A-106D in FIG. 1), and a communications interface 206. The controller 200 is also connected to the control board 108. The communications interface 206 is connected to the network 112 to enable the controller 200 to communicate with the server 114. The controller 200 includes combinations of hardware and software that are operable to, among other things, control the operation of the system 100, control the operation of the lighting fixture 102, control the operation of the camera 110, receive one or more signals from the camera 110, communicate over the network 112, communicate with the control board 108, receive input from a user via the user interface 204, provide information to a user via the indicators 202, etc. In some embodiments, the indicators 202 and the user interface 204 are integrated together in the form of, for instance, a touch-screen.

In the embodiment illustrated in FIG. 2, the controller 200 is associated with the user input device 106A-106D. As a result, the controller 200 is illustrated in FIG. 2 as being connected to the control board 108 which is, in turn, connected to the lighting fixtures 102 and the cameras 110. In other embodiments, the controller 200 is included within the control board 108, and, for example, the controller 200 can provide control signals directly to the lighting fixtures 102 and the cameras 110. In other embodiments, the controller 200 is associated with the server 114 and communicates through the network 112 to provide control signals to the control board 108, the lighting fixtures 102, and/or the cameras 110.

The controller 200 includes a plurality of electrical and electronic components that provide power, operational control, and protection to the components and modules within the controller 200 and/or the system 100. For example, the controller 200 includes, among other things, a processing unit 208 (e.g., a microprocessor, a microcontroller, or another suitable programmable device), a memory 210, input units 212, and output units 214. The processing unit 208 includes, among other things, a control unit 216, an arithmetic logic unit ("ALU") 218, and a plurality of registers 220 (shown as a group of registers in FIG. 2), and is implemented using a known computer architecture (e.g., a modified Harvard architecture, a von Neumann architecture, etc.). The processing unit 208, the memory 210, the input units 212, and the output units 214, as well as the various modules or circuits connected to the controller 200 are connected by one or more control and/or data buses (e.g., common bus 222). The control and/or data buses are shown generally in FIG. 2 for illustrative purposes. The use of one or more control and/or data buses for the interconnection between and communication among the various modules, circuits, and components would be known to a person skilled in the art in view of the embodiments described herein.

The memory 210 is a non-transitory computer readable medium and includes, for example, a program storage area and a data storage area. The program storage area and the data storage area can include combinations of different types of memory, such as a ROM, a RAM (e.g., DRAM, SDRAM, etc.), EEPROM, flash memory, a hard disk, an SD card, or other suitable magnetic, optical, physical, or electronic memory devices. The processing unit 208 is connected to the memory 210 and executes software instructions that are capable of being stored in a RAM of the memory 210 (e.g., during execution), a ROM of the memory 210 (e.g., on a generally permanent basis), or another non-transitory computer readable medium such as another memory or a disc. Software included in the implementation of the system 100 and controller 200 can be stored in the memory 210 of the controller 200. The software includes, for example, firmware, one or more applications, program data, filters, rules, one or more program modules, and other executable instructions. The controller 200 is configured to retrieve from the memory 210 and execute, among other things, instructions related to the control processes and methods described herein. In other embodiments, the controller 200 includes additional, fewer, or different components.

The user interface 204 is included to provide user control of the system 100, the lighting fixtures 102, and/or the cameras 110. The user interface 204 is operably coupled to the controller 200 to control, for example, control or drive signals provided to the lighting fixtures 102 and/or control or drive signals provided to the cameras 110. The user interface 204 can include any combination of digital and analog input devices required to achieve a desired level of control for the system 100. For example, the user interface 204 can include a computer having a display and input devices, a touch-screen display, a plurality of knobs, dials, switches, buttons, faders, or the like. In the embodiment illustrated in FIG. 2, the user interface 204 is separate from the control board 108. In other embodiments, the user interface 204 is included in the control board 108.

The controller 200 is configured to work in combination with the control board 108 to provide direct control or drive signals to the lighting fixtures 102 and/or the cameras 110. As described above, in some embodiments, the controller 200 is configured to provide direct control or drive signals to the lighting fixtures 102 and/or the cameras 110 without separately interacting with the control board 108 (e.g., the control board 108 includes the controller 200). The direct drive signals that are provided to the lighting fixtures 102 and/or the cameras 110 are provided, for example, based on a user input received by the controller 200 from the user interface 204. The controller 200 is also configured to receive one or more signals from the cameras 110 related to image or scan data.

Figure 2A:
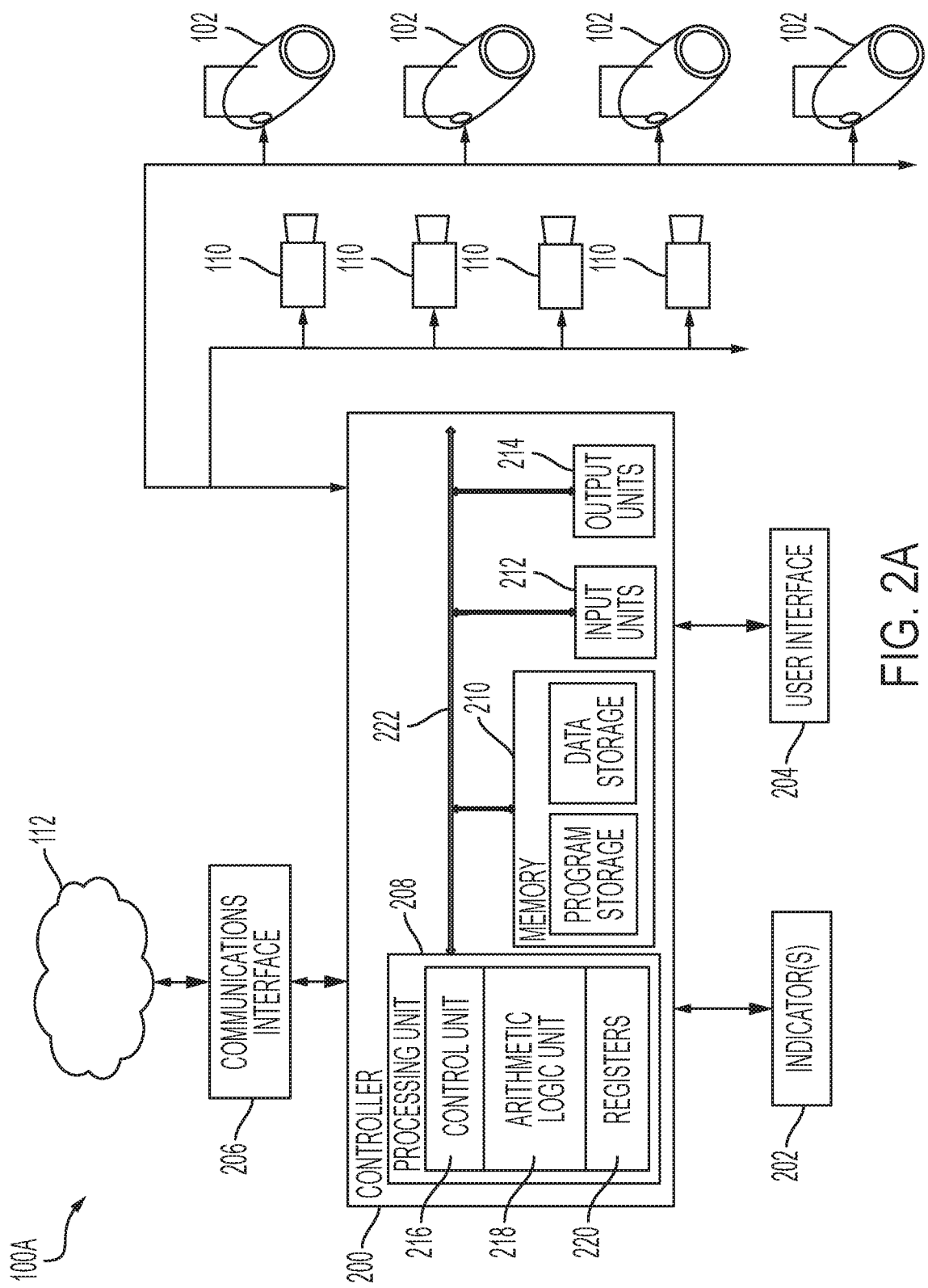
FIG. 2A illustrates a controller for the system of FIG. 1A.

As shown in FIG. 2A and described above, the system 100A includes the controller 200 configured to work without the control board 108, such that the controller 200 is configured to provide signals to the lighting fixtures 102 and/or the cameras 110 and to receive one or more signals from the cameras 110 related to image or scan data.

Figure 3:
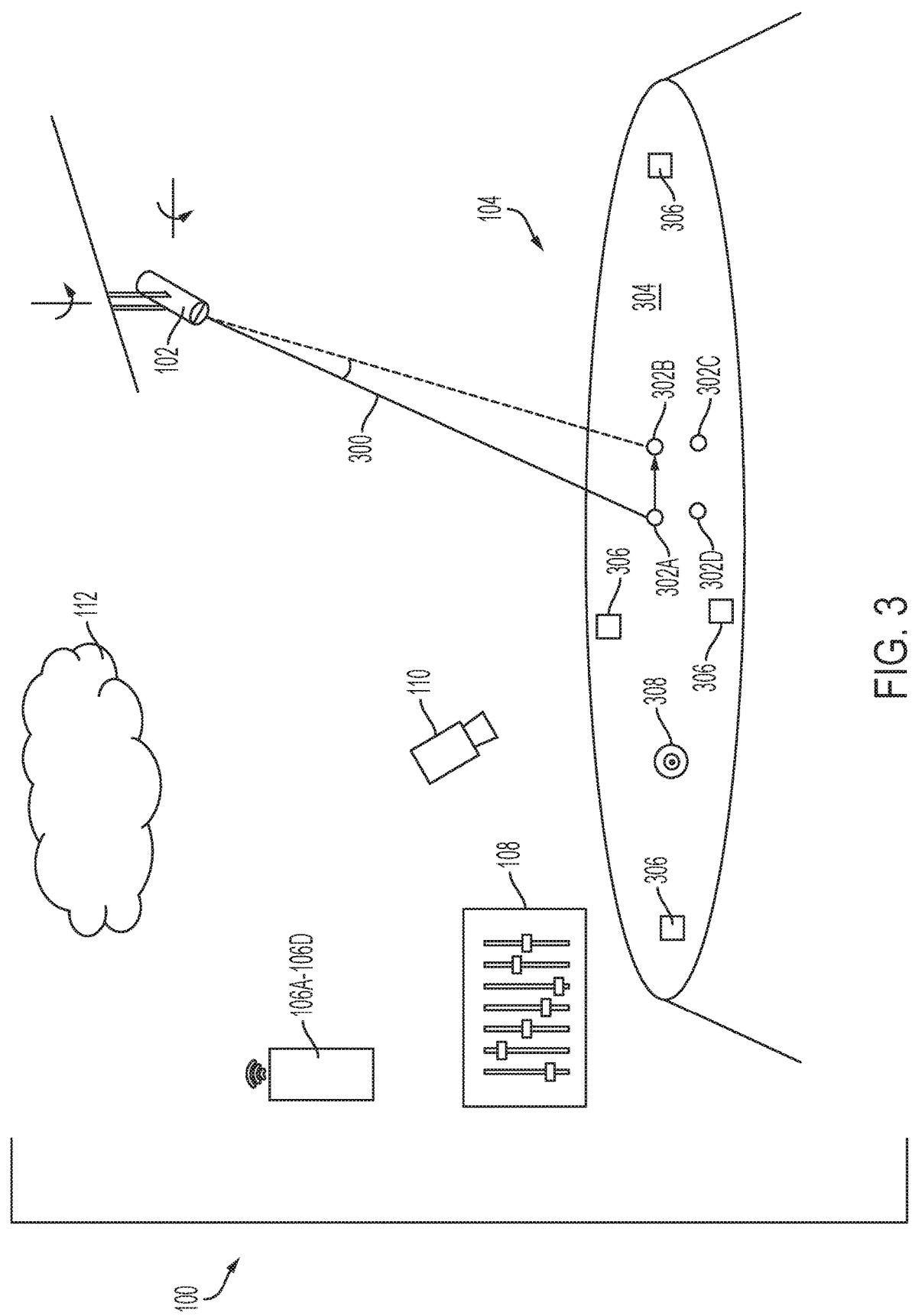
FIG. 3 illustrates cameras and lighting fixtures in a venue for the system of FIG. 1.

FIG. 3 illustrates the control board 108, the lighting fixture 102, the camera 110, and the user input device 106A-106D of the system 100 in the venue 104. The user input device 106A-106D directs the lighting fixture 102 such that a lighting beam 300 projecting from the lighting fixture 102 strikes at discrete locations 302A, 302B, 302C, 302D on a stage surface 304 at the venue 104. A user may directly control the movement of the lighting fixture 102, or the lighting fixture 102 may move according to a preprogrammed pattern.

Figure 3A:
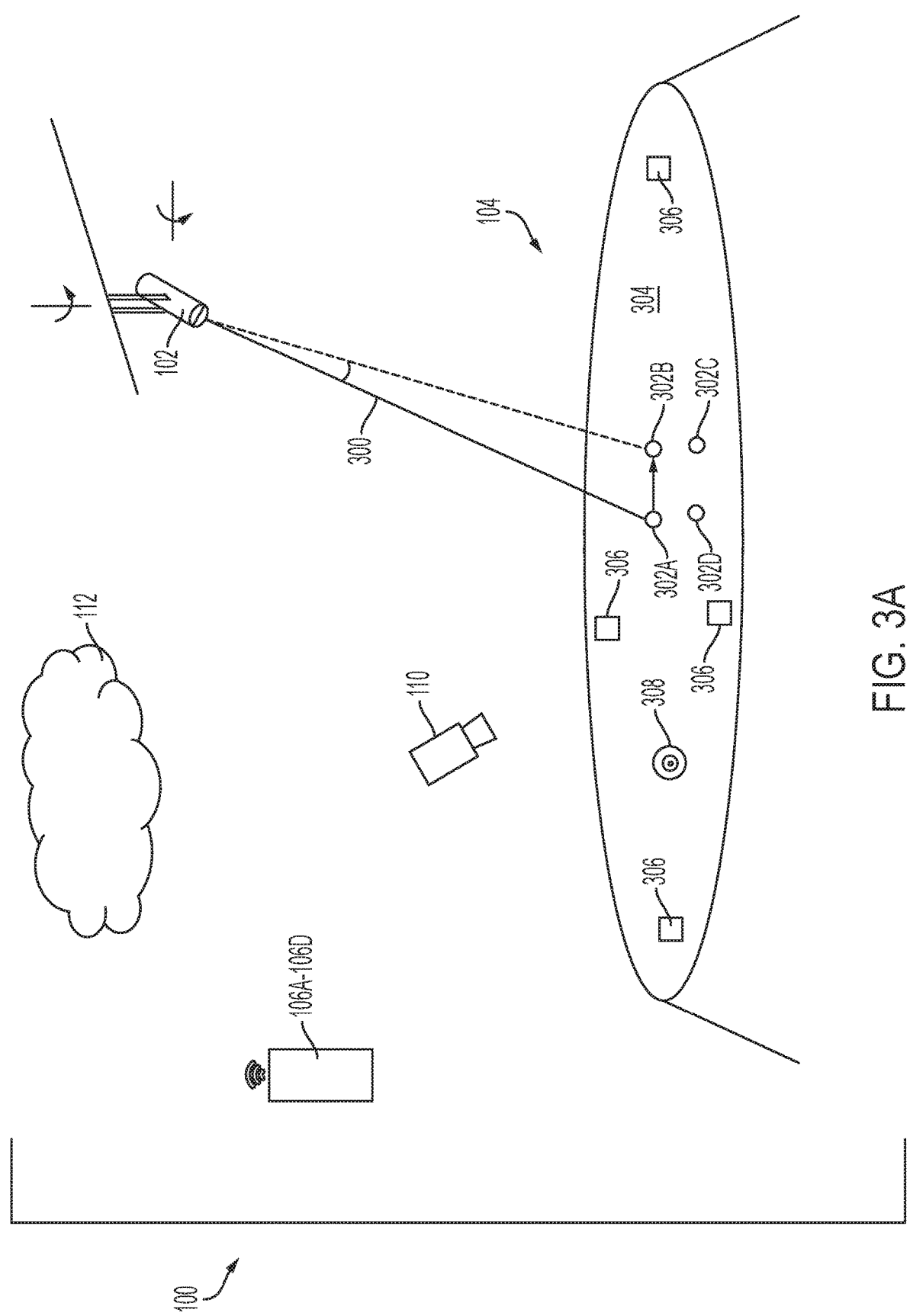
FIG. 3A illustrates cameras and lighting fixtures in a venue for the system of FIG. 1A.

FIG. 3A illustrates the system 100A in the venue 104. As described above, the system 100A removes the control board 108, and the user input device 106A-106D is configured to directly communicate with the lighting fixture 102 and the camera 110.

With reference to the system 100 and/or the system 100A, FIG. 4 illustrates an example of an application interface screen 400 for use with the user device 106A-106D that receives user input to control the movement of the lighting fixture 102 for synchronizing the position of the lighting beam 300 with the discrete locations 302 on the ground in the venue 104. In some embodiments, the lighting beam 300 moves to at least three locations (302A, 302B, 302C). Other embodiments include the lighting beam 300 moving to a fourth location 302D. Other embodiments include the lighting beam 300 moving to more than four locations 302. The movement of the lighting fixture 102 is accomplished by changing the angle of the lighting fixture 102 by either panning or tilting the lighting fixture 102. The controller 200 is configured to store the angular change data corresponding to the lighting fixture 102 movement to move the lighting beam 300 from the first location 302A to the second location 302B, from the second location 302B to the third location 302C, and so on.

With reference to FIGS. 3 and 3A, the controller 200 is further configured to store the coordinate data of each of the at least three locations 302 on the surface 304. In some embodiments, the coordinate data is input by a user, such as when the user directly controls the movement of the lighting fixture 102. In some embodiments, multiple locations 302 are plotted in a model, and the user indicates a desired lighting beam destination 308 by, for example, standing at one of the locations 302 while holding the user device 106A-106D. Once the lighting beam 300 is projecting onto the desired lighting beam destination 308 that is also one of the locations 302, the user can designate the present lighting beam destination 308 as corresponding to the particular location 302 by, for instance, selecting the appropriate one of the locations 302 from a list.

In some embodiments, the coordinate data is determined by the controller 200 by calculating a position of the user device 106A-106D relative to one or more reference points 306 with scan data from one or more cameras 110. The cameras 110 may be integrated into the user device 106A-106D, wirelessly connected to the user device 106A-106D, connected by wire to the user device 106A-106D, or otherwise associated. The reference points 306 provide orientation and distance information for the user device 106A-106D. In some embodiments, the reference points 306 are visible marks on the surface 304. Other embodiments include at least one reference point 306 in the form of a sensor readable marker that is not visible to the human eye (e.g., an infrared marker). Using known computer vision, image recognition, and scanning applications (e.g., a simultaneous localization and mapping ["SLAM"] program), the controller 200 can calculate distances between designated points on the surface 304 after the user device 106A-106D has been properly calibrated with the reference points 306.

Figure 5:
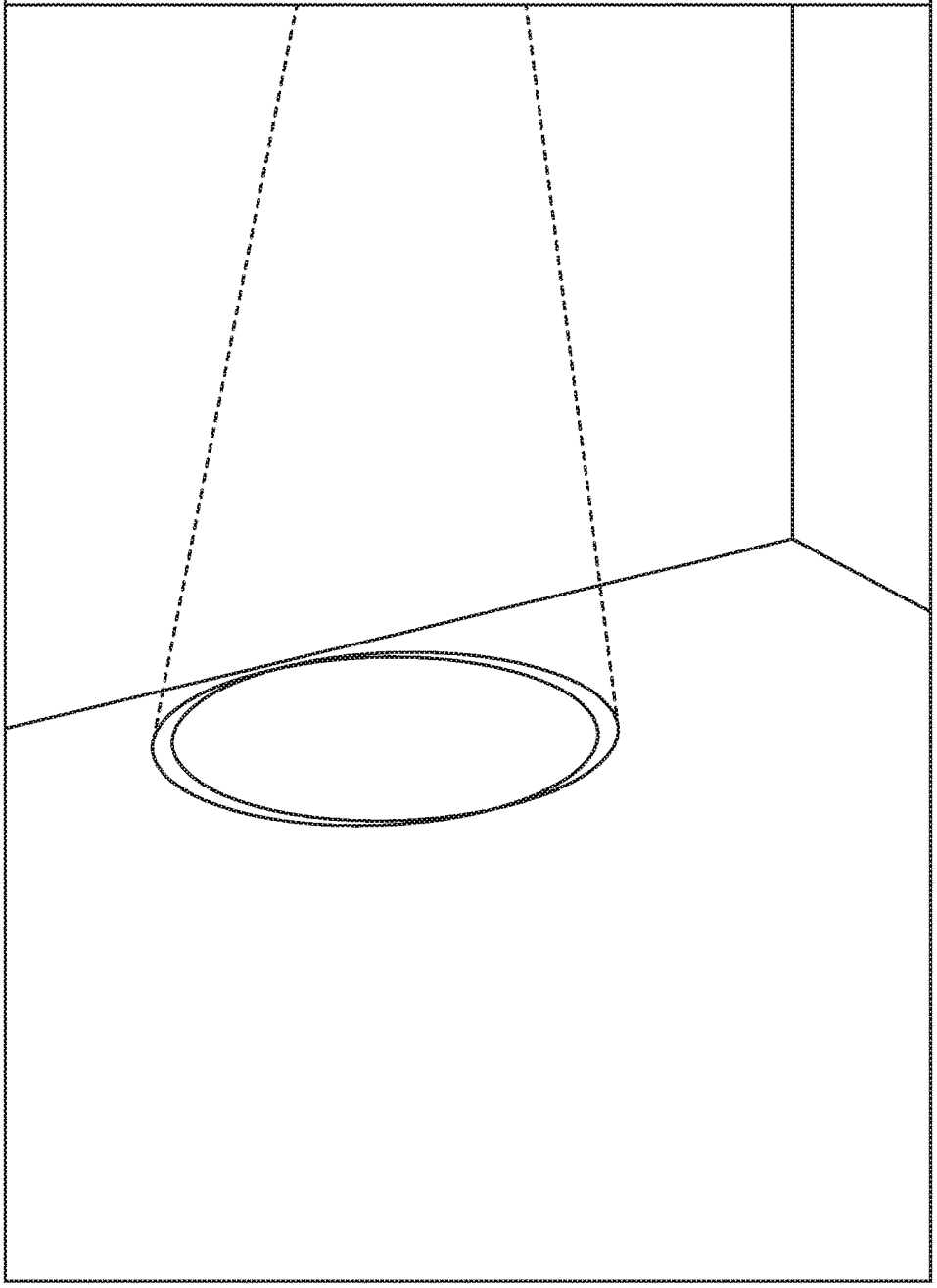
FIG. 5 illustrates a scan of a surface a camera may detect to determine a centroid of a lighting beam.

To determine the discrete locations 302 where the lighting beam 300 contacts the surface 304 without user input information regarding the locations, the controller 200 is configured to determine a centroid of the lighting beam through scan data provided by the camera 110. An example of the scan of the surface 304 that the camera 110 may perform is shown in FIG. 5. The centroid can be found regardless of angle of attack of the lighting beam 300 through any appropriate method including, for example, light intensity analysis of the surface 304. As such, at each of the discrete locations 302, the image data of the lighting beam 300 is captured by the camera 110 and analyzed by the controller 200. Once the analysis is complete, the controller 200 is configured to return values for the coordinate data of each of the discrete locations 302 relative to the one or more reference points 306.

Because the lighting fixture 102 control is paired with the controller 200, the controller 200 is able to quantify the change in angle each time the lighting fixture 102 moves. Although this change in angle is known to the controller 200 as a relative angle of the lighting fixture 102 from one position to another and not an absolute angle relative to the surface 304, the absolute angles can be found through mathematical calculations using a perspective inversion solution described generally below.

To calculate the position of the lighting fixture 102 relative to the stage surface 304, the perspective inversion solution uses the length of each side of a triangle that is traced by the lighting beam 300 on the stage surface 304 and the changes in angle of the lighting fixture 102 that created that triangle. The length of the sides of the triangle can be found with the at least three locations 302 coordinate data input and/or calculation as described above. The angles are known by virtue of the controller 200 controlling the lighting fixture 102, as described above.

Because there can be a degree of uncertainty present when calculating the position of the lighting fixture 102 based on only three discrete locations 302A, 302B, and 302C, some embodiments include a fourth discrete location 302D. With four discrete locations 302A, 302B, 302C, 302D, the controller 200 is configured to sequentially determine sets of three discrete locations (e.g., 302A, 302B, and 302C first, 302B, 302C, and 302D second, 302A, 302C, and 302D third, etc.) and is configured to return a value for the lengths of the lighting beam 300 as it existed when it was directed to each of the discrete locations 302A, 302B, 302C, 302D.

The controller 200 is then configured to compare these results as they overlap in order to calculate the values with greater certainty. Other embodiments include more than the four discrete locations 302. Such embodiments add even further accuracy to the calculation. Once the length of the lighting beam 300 from the lighting fixture 102 to each individual discrete location 302A, 302B, 302C, 302D is found, the controller 200 is configured to, for example, trilaterate or quadrilaterate the location of the lighting fixture 102. The point at which the spheres of possible solutions for the discrete locations 302A, 302B, 302C, 302D cross is designated as the location of the lighting fixture 102. This calculation actually returns two results-one above the stage surface 304 and one below the stage surface 304. The controller 200 is configured to discard the result below the stage surface 304.

In some embodiments of the system 100 and/or the system 100A, the controller 200 is further configured to run an optimizer operation with the possible positions of the lighting fixture 102. Because the measurements could be off slightly or the control feedback may have noise in the signal, an optimizer operation can more accurately determine the position of the lighting fixture 102 (e.g., improve accuracy of the position of the lighting fixture). The optimizer runs calculations using the law of cosines with the values it has from previously running the perspective inversion solution. The optimizer takes the length of the lighting beam 300 from the lighting fixture 102 to each individual discrete location 302A, 302B, 302C, 302D, combines that data with the known changes in angle of the lighting fixture 102, and determines possible values for the distances on the stage surface 304 between the discrete locations 302A, 302B, 302C, 302D. Because these distances are known through measurement or other methods described above, the optimizer compares these known distances with the determined distances to gauge the accuracy of the results from the perspective inversion solution.

An example of an appropriate optimizer operation is a limited memory Broyden-Fletcher-Goldfarb-Shanno ("LBFGS") optimizer, although other optimizer operations may be used. If the optimizer operation returns results that converge to a value, that particular value is determined to be more accurate than the initial value. If the results do not converge to a value and instead scatter, the initial value is returned as accurate enough to continue without further attempting the optimizer operation. After these steps, the location of the lighting fixture 102 is again trilaterated (or quadrilaterated). This location is then output as the most accurate estimation of the position of the lighting fixture 102 relative to the stage surface 304 (or the reference points 306).

After the controller 200 has determined the position of the lighting fixture 102, the controller 200 is configured to determine the orientation of the lighting fixture 102 relative to the stage surface 304. In some embodiments, however, the position calculation for the lighting fixture 102 and the orientation calculation for the lighting fixture 102 are both accomplished with the optimizer operation.

The controller 200 uses any three of the discrete locations 302 on the stage surface 304 and the corresponding relative angular change information from the control of the lighting fixture 102. The relative angular change information includes pan, tilt, or both pan and tilt. The controller 200 determines spherical coordinates of the discrete locations 302 receiving the lighting beam 300 as the lighting fixture 102 is oriented in each position. These spherical coordinates are relative spherical coordinates, in that they include pan and tilt angles of the lighting fixture 102 relative to the axis of the lighting beam 300, and the origin is the position of the lighting fixture 102 (i.e., the focal point of the lighting beam 300).

The controller 200 is configured to translate the known Cartesian coordinates of the found position of the lighting fixture 102 and the known discrete locations 302 relative to the reference points 306 into real-world spherical coordinates with the lighting fixture 102 as the origin. Some embodiments include the reference points 306 being one of the known discrete locations 302 in this calculation.

The controller 200 is then configured to perform a matrix transformation utilizing both the relative spherical coordinates and the real-world spherical coordinates to translate the relative spherical coordinates of the orientation of the lighting fixture 102 at each position into real-world spherical coordinates (e.g. relative to a reference plane, which may be referred to as absolute spherical coordinates). Once this relationship is determined, the yaw, pitch, and roll information of the orientation of the lighting fixture 102 relative to the stage surface 304 is extracted. In some embodiments, the yaw, pitch, and roll may be referred to as absolute angles of the lighting fixture 102 with reference to the surface 304, which includes a plane of the discrete locations 302A, 302B, 302C, and 302D. This information is the absolute orientation of the lighting fixture 102 regardless of mounting methods.

After the above calculations have been completed, the controller 200 is configured to present the results as the indicated position and orientation of the lighting fixture 102 (e.g., the controller 200, or a user device 106A-106D is paired with the three-dimensional model space of the venue). With this information, the controller 200 can alter image data relating to the lighting fixture 102 and the lighting beam 300 in an interactive environment and control the lighting fixture 102. Once the lighting fixtures 102 in the venue 104 have been identified, classified, and located, the above calculated information can be used to implement transitions of various styles.

It should be noted, however, that the three-dimensional model space of the venue may, in some embodiments, be rendered for observation by the user, but, in other embodiments, may instead be used for internal calculations by the system 100, 100A without producing a rendering of the model for user observation or interaction.

With continued reference to FIGS. 3 and 3A, the above calculated information can also be used to alter command string data sent to the lighting fixture 102 in order to translate locations 308 designated on the surface 304 into appropriate angular changes of the lighting fixture 102 to cause the lighting beam 300 to be directed to the designated locations 308. Some embodiments of the system 100, 100A include the controller 200 configured to control the lighting fixture 102 according to the altered command string data.

Figure 6:
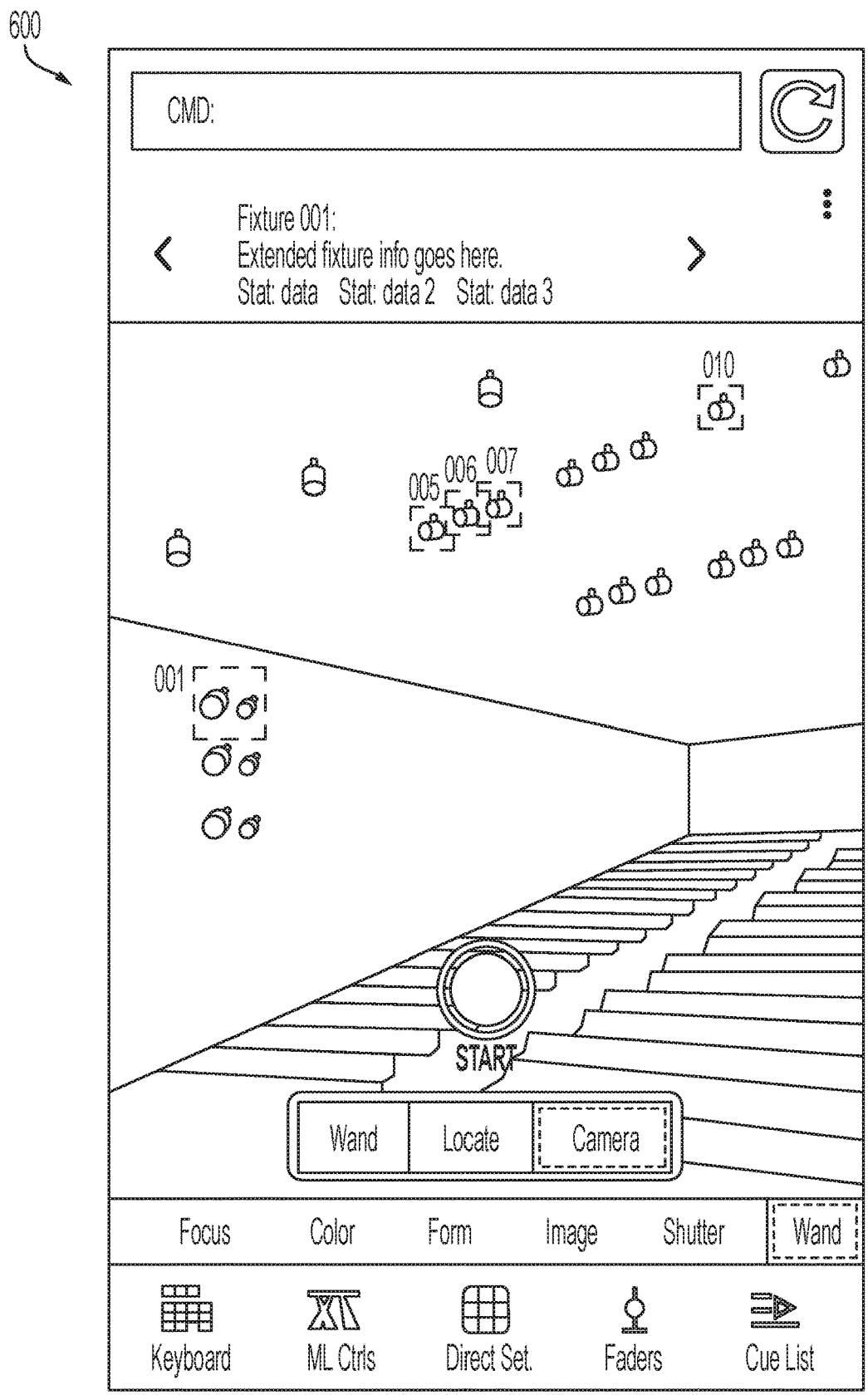
FIG. 6 illustrates an application interface screen for use with the system of FIG. 1 and/or FIG. 1A for controlling the movement of a lighting fixture according to a user input designating a lighting beam destination.

In some embodiments, the indication of the locations 308 is made on a touchscreen of the user device 106A-106D utilizing an augmented reality interface (through, for instance, an application interface screen 600 as shown in FIG. 6). In such an interface, the user sees the surface 304 on the touchscreen and may point to a destination 308 on the surface 304 on the touchscreen. The controller 200 is configured to then convert this indicated portion of the screen into an equivalent position of the destination 308 on the surface 304. The controller 200 is configured to relate the orientation of the capture view of the camera 110 with the surface 304 based on a calibration with one or more reference points 306.

Additionally or alternatively, the system 100, 100A uses one or more inertial measurement units ("IMUs") coupled with the user device 106A-106D to determine the position and orientation data of the user device 106A-106D. Cameras 110 may not be necessary in this instance, but the user device 106A-106D would be paired to the three-dimensional model space by positioning and orienting the device in a known home arrangement and recording the data from the IMUs at that home arrangement. In embodiments of the system 100, 100A using augmented reality libraries (e.g., ARCore, ARKit, etc.), both IMUs and cameras 110 can be utilized to improve accuracy of the data.

In some embodiments, the system 100, 100A uses one or more sensors (one example of which being the cameras 110) to determine the position of the user device 106A-106D. As stated above, the one or more sensors can include cameras 110 and/or IMUs. Additionally or alternatively, the one or more sensors can include a Wi-Fi, Bluetooth, ZigBee, or other system having one or more proximity beacons. Other example sensors can include infrared cameras, thermal cameras, depth cameras, ultra-wideband (UWB) radar sensors, or the like to determine focus points of the lighting beam 300 at each location 302.

Once the real-world position of the destination 308 on the surface 304 is determined, the controller 200 is configured to send a control signal to one or more motors to actuate movement of the lighting fixture 102. The lighting fixture 102 moves to the appropriate orientation to project the lighting beam 300 at the destination 308. For example, the controller 200 is configured to translate the real-world Cartesian coordinates of the destination 308 into the altered control string described above to operate the lighting fixture 102 such that the lighting beam 300 moves appropriately in the three-dimensional model space.

In some embodiments of the system 100, 100A, the indication of the desired destination 308 for the lighting beam 300 on the surface 304 at the venue 104 can be made by aiming the center of the capture view of the camera 110 at the destination 308. As described above, the controller 200 is configured to convert this center of the capture view into an equivalent position of the destination 308 on the actual surface 304. In this configuration, the indication of the desired destination 308 may be actuated by a distinct command, such as a voice command, the press of a button, or the like. Additionally or alternatively, the indication of the desired destination 308 is switched to a continual or continuous mode, such that the desired destination 308 moves simultaneously or with some delay relative to the changing capture view of the camera 110 as the camera 110 is moved throughout the venue 104. In some embodiments, this mode can be used as a follow spot control.

In some embodiments of the system 100, 100A, the indication of the desired destination 308 of the lighting beam 300 on the surface 304 at the venue 104 is made by pointing an end of the user device 106A-106D in a direction with the camera view of the camera 110 pointing in an orthogonal direction. With a smartphone 106D, for instance, a user could point the top end of the smartphone 106D at the desired location 308 while the camera 110 is directed toward the surface 304. In this configuration, the lighting beam destination 308 may be set at a constant distance, potentially designated by the user, from the end of the smartphone 106D or from the center of the capture view of the camera 110 in an orthogonal direction from the direction of the capture view. In some embodiments, the user device 106A-106D determines the location of the desired destination 308 by pointing the end of the user device 106A-106D to the desired destination 308, and using the known location (coordinates) of the user device 106A-106D in the venue along with a tilting angle of the device 106A-106D relative to the surface 304 (e.g., determined using internal IMUS of the device 106A-106D) to determine the location of the of the desired destination 308 in the venue 104.

In some embodiments of the system 100, 100A, the indication of the desired destination 308 of the lighting beam 300 is set as the location of the user device 106A-106D itself. The controller 200 determines the location of the user device 106A-106D based on the capture data from the camera 110. This data is processed to calculate the location relative to one or more reference points 306. The controller 200 is configured to designate the current location of the user device 106A-106D relative to the reference points 306 as the destination 308. As described above, the indication of the desired destination 308 as the location of the user device 106A-106D can be actuated by a distinct command. Additionally or alternatively, the indication of the user device 106A-106D as the destination 308 may be switched to a continuous or continual mode.

Figure 7:
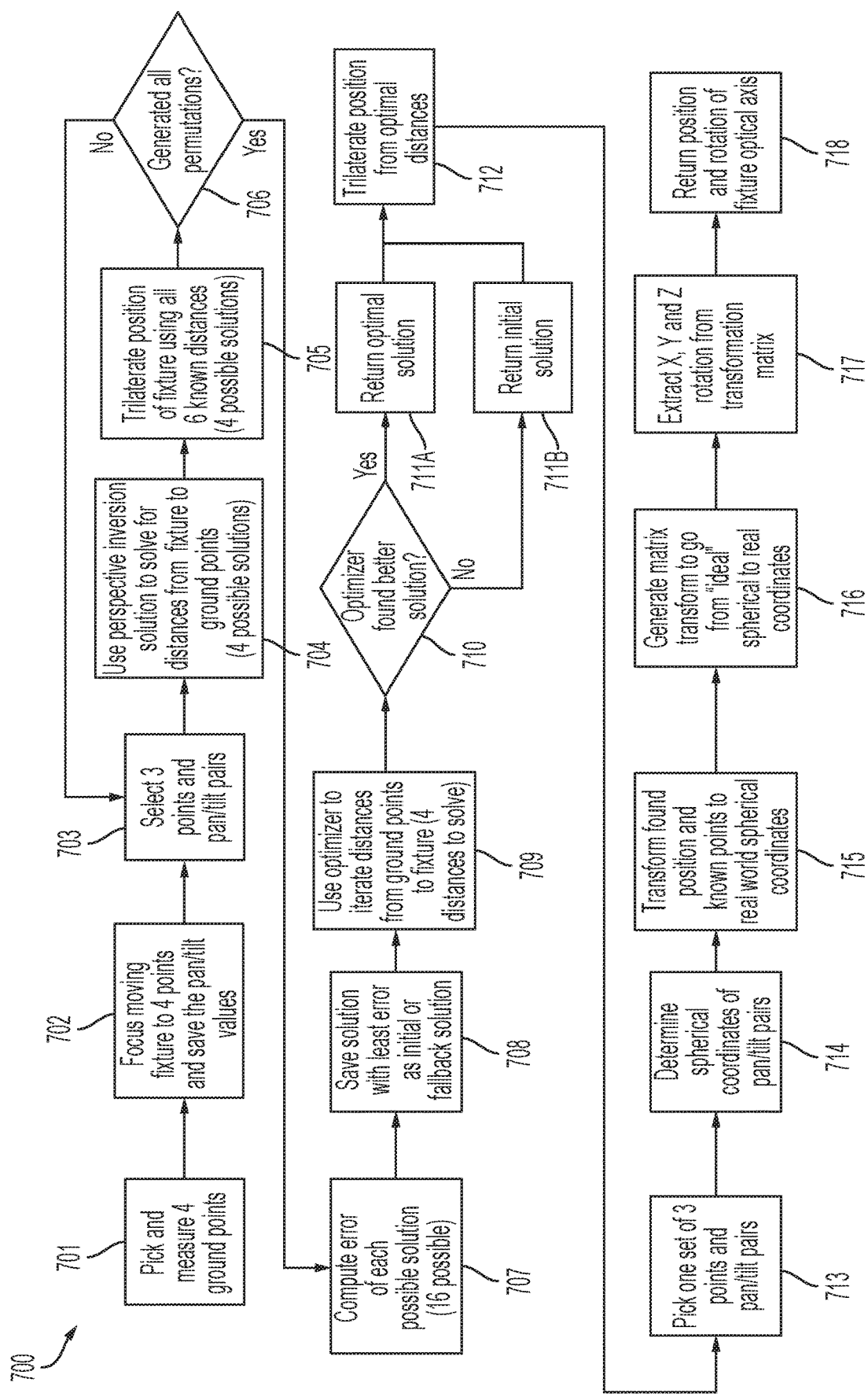
FIG. 7 illustrates a process for determining a lighting fixture arrangement.

As shown in FIG. 7, the system 100, 100A may operate according to a method 700 to calculate the arrangement information of the lighting fixture 102. First, the user chooses and measures four discrete physical locations 302A, 302B, 302C, 302D on the surface 304 (STEP 701).

The user then focuses the lighting fixture 102 at each of the four discrete locations 302A, 302B, 302C, 302D and saves the resulting angular change values for the pan and tilt of the lighting fixture (STEP 702). Next, either the controller 200 or the user selects any three of the four discrete locations 302A, 302B, 302C, 302D and the corresponding angular changes the lighting fixture 102 made to direct the lighting beam 300 to each of the respective selected discrete locations 302A, 302B, 302C, 302D (STEP 703).

A perspective inversion solution is used to solve for the distances from the discrete locations 302A, 302B, 302C, 302D on the surface 304 to the lighting fixture 102 (STEP 704). Once all the values for the distances have been determined, the position of the lighting fixture 102 is trilaterated (STEP 705).

The controller 200 then determines whether all of the possible combinations of three of the discrete locations 302A, 302B, 302C, 302D and corresponding angular changes have been calculated with the perspective inversion solution (STEP 706). If not all possible combinations have been calculated, the method 700 returns to STEP 703 to complete the other possible combinations.

If, at STEP 706, all possible combinations have been calculated, the process 700 proceeds to compute an error of each possible solution found (STEP 707). Next, the controller 200 saves the solution with the fewest errors as the best initial solution for the position of the lighting fixture 102 (STEP 708). The best initial solution is then used as an input to attempt to optimize (e.g., improve accuracy of) the result by running calculations using the law of cosines (STEP 709). The controller 200 then determines whether the optimization operation converged on a solution (STEP 710).

If the optimization operation converged on a solution, the optimal solution is returned as the solution for the length of the light beam 300 from each of the discrete locations 302A, 302B, 302C, 302D to the lighting fixture 102 (STEP 711A) instead of the previous best initial solution from STEP 708. If the optimization operation did not converge on a solution, the controller 200 ignores the optimization operation and returns the best initial solution from STEP 708 (STEP 711B). The controller 200 then determines the position of the lighting fixture 102 through trilateration with the best available lengths (STEP 712).

Now that the position of the lighting fixture 102 has been determined, the controller 200 selects one set of three of the discrete locations 302 and the corresponding changes in angle of the lighting fixture 102 (STEP 713). The spherical coordinates of the discrete locations 302 are found with the lighting fixture 102 serving as the point of origin (STEP 714). Then, the known Cartesian coordinates of the discrete locations 302 and the lighting fixture 102 are converted to real-world spherical coordinates (STEP 715) with the lighting fixture 102 as the origin. A matrix transformation is performed to translate the relative spherical coordinates of the lighting fixture 102 into absolute spherical coordinates (STEP 716). The yaw, pitch, and roll information of the lighting fixture 102 is then determined and extracted (STEP 717). The controller 200 then returns the position and orientation of the lighting fixture 102 relative to the surface 304 and the reference point 306 (STEP 718).

Although STEPS 713-717 were described above, some embodiments of the method 700 includes the position calculation for the lighting fixture 102 and the orientation calculation for the lighting fixture 102 both being accomplished during the optimization step (STEP 709) and proceeding from STEP 712 directly to STEP 718.

Figure 8:
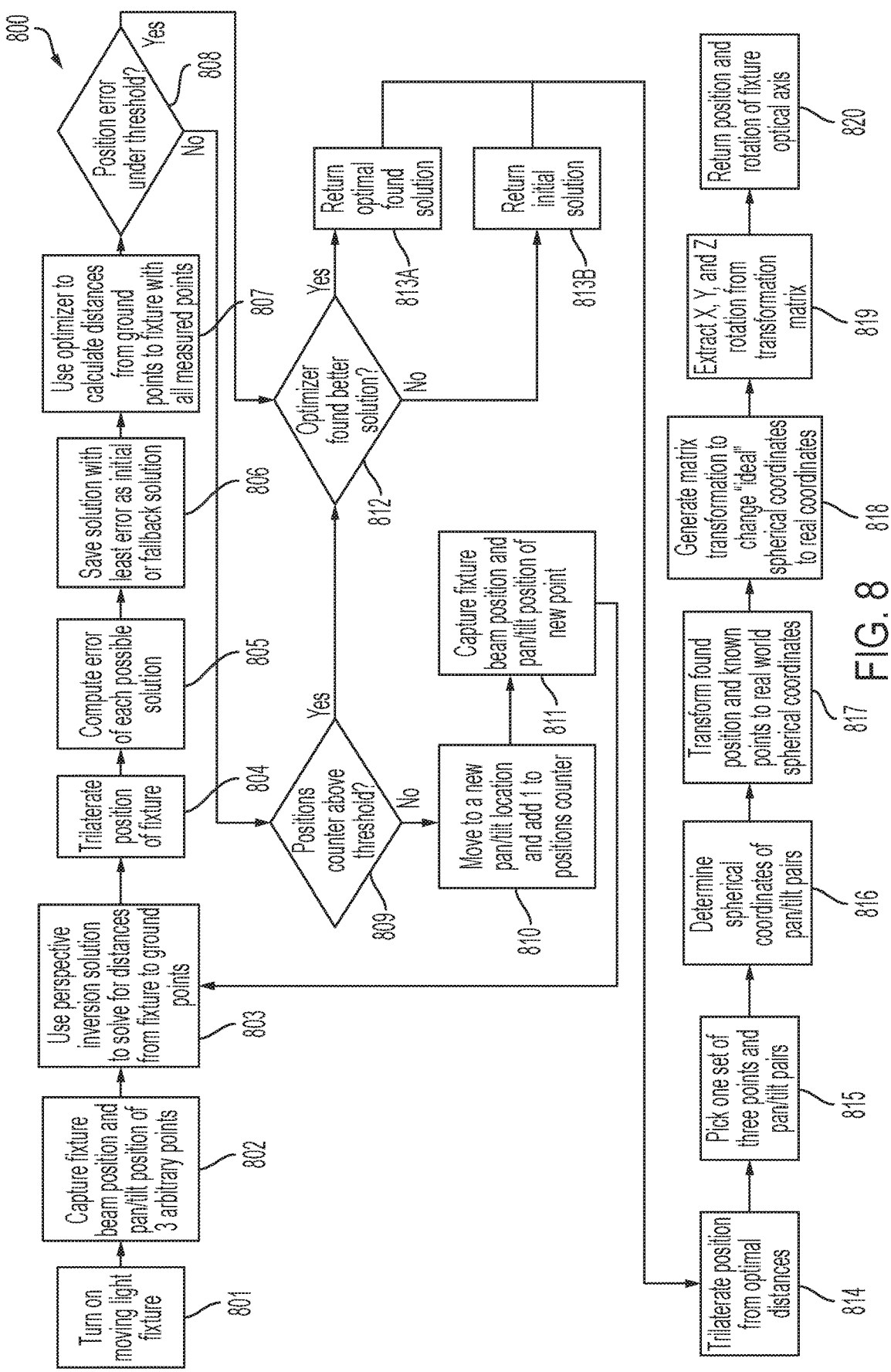
FIG. 8 illustrates a process for determining a lighting fixture arrangement.

With reference to FIG. 8, the system 100, 100A may additionally or alternatively operate according to a method 800 to calculate the arrangement information of the lighting fixture 102. First, the lighting fixture 102 is turned on (STEP 801). A control routine is operated, and the controller 200 records the set angle of the lighting fixture 102 while the camera 110 captures the discrete location 302 of the lighting beam 300 on the surface 304 at three arbitrary points (STEP 802). The controller 200 then calculates the distances from the discrete locations 302 to the lighting fixture 102 (STEP 803). These distances are used to trilaterate the position of the lighting fixture 102 (STEP 804).

The method 800 then moves to STEP 805, where the error of each possible solution is calculated. The controller 200 saves the solution with the least errors as the best initial solution for the position of the lighting fixture 102 (STEP 806). The best initial solution is used as an input to attempt to optimize the result by running calculations using the law of cosines (STEP 807). The controller 200 then determines whether the initial solution (after optimization) for the position of the lighting fixture 102 is known with enough accuracy to be below an error threshold (STEP 808).

If the position error is not less than the error threshold at STEP 808, the controller 200 determines whether the number of discrete locations 302 recorded by a positions counter is above a threshold value (STEP 809). The threshold positions value may be any appropriate number including, for instance, ten discrete locations 302. If, at STEP 809, the positions counter is less than the threshold value, the controller 200 moves the lighting fixture 102 to a new angular position (STEP 810) and increases the value stored in the positions counter by one. Next, the controller 200 captures data corresponding to another discrete location 302 (STEP 811). After capturing the data corresponding to another discrete location 302 (STEP 811), the method 800 returns to STEP 803 to recalculate the distances from the discrete locations 302 to the lighting fixture 102. The method 800 continues through STEPS 804-807.

This portion of the method 800 loops until either the initial solution (after optimization) is found within the error threshold or the number stored in the positions counter is above the threshold value. In some embodiments, the addition of the fourth discrete location 302D makes the initial solution fall within the error threshold. In other embodiments, five or more discrete locations 302 are used. In other embodiments, only the initial three discrete locations 302A, 302B, and 302C are used to get an initial solution that is within the error threshold. If, at STEP 808, position error is less than or equal to the error threshold, the method 800 continues to STEP 812. Similarly, if the new initial solution found at STEP 806 is sufficiently accurate after optimization and after the method 800 has continued through the loop of STEPS 807-811 and 803-808, the method 800 continues to STEP 812. Further, if the initial solution found at STEP 806 and optimized at STEP 807 is not within the error threshold but the positions counter has a value that is above the positions threshold, the method 800 continues to STEP 812 without trying further discrete locations 302.

The controller 200 then determines whether the optimization operation converged on a solution (STEP 812). If the optimization operation converged on a solution, the optimal solution is returned as the solution for the lengths of the light beam 300 from each of the discrete locations 302 to the lighting fixture 102 (STEP 813A) instead of the previous best initial solution from STEP 806. If the optimization operation did not converge on a solution, the controller 200 ignores the optimization operation and returns the best initial solution from STEP 806 (STEP 813B). The controller 200 then calculates the position of the lighting fixture 102 for a final time through trilateration with the best available values for the lengths from the discrete locations 302 to the lighting fixture 102 (STEP 814).

With the position of the lighting fixture 102 determined, the controller 200 selects one set of three of the discrete locations 302 and the corresponding changes in angle of the lighting fixture 102 (STEP 815). The spherical coordinates of the discrete locations 302 are found with the lighting fixture 102 serving as the point of origin (STEP 816). Then, the known Cartesian coordinates of the discrete locations 302 and the lighting fixture 102 are converted to real-world spherical coordinates (STEP 817) with the lighting fixture 102 as the origin. A matrix transformation is performed to translate the relative spherical coordinates of the lighting fixture 102 into absolute spherical coordinates (STEP 818). The yaw, pitch, and roll information of the lighting fixture 102 is then found and extracted (STEP 819). The controller 200 then determines the position and orientation of the lighting fixture 102 relative to the surface 304 and the reference point 306 (STEP 820).

Although STEPS 815-819 were described above, some embodiments of the method 800 include the position calculation for the lighting fixture 102 and the orientation calculation for the lighting fixture 102 both being accomplished during the optimization step (STEP 807) and proceeding from STEP 814 directly to STEP 820.

Figure 9:
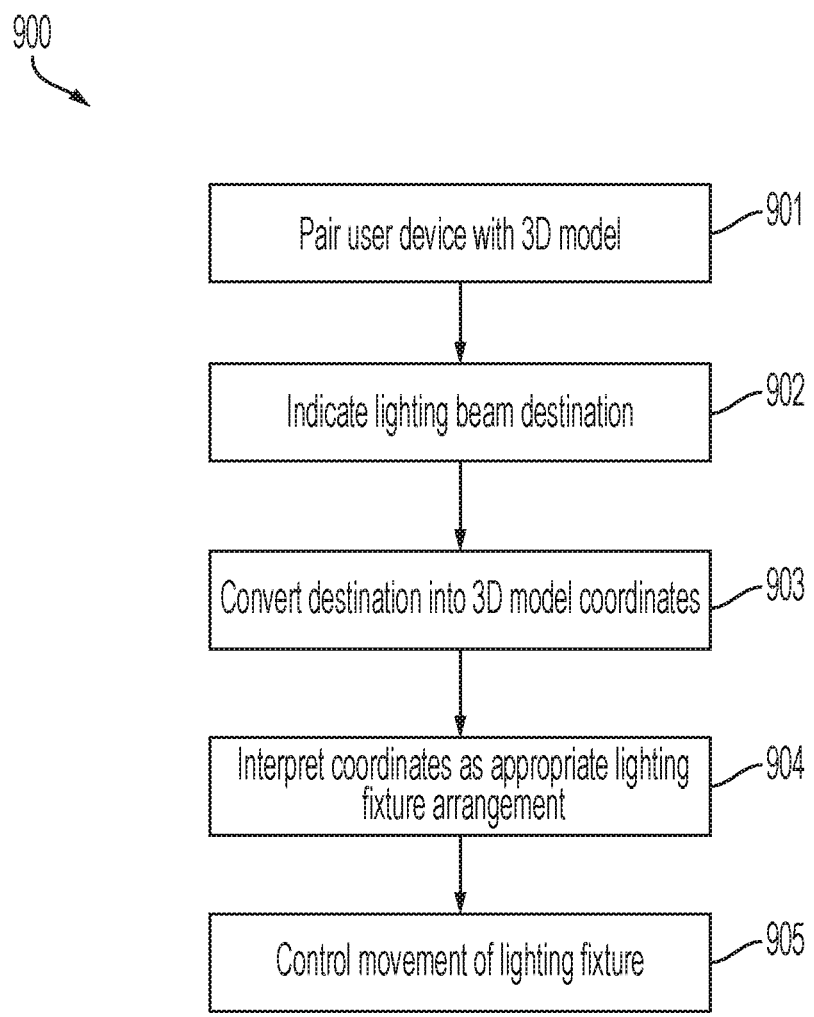
FIG. 9 illustrates a process for directing a lighting fixture in a venue.

With reference to FIG. 9, a method 900 of directing a lighting fixture 102 in the venue 104 is shown. The system 100, 100A may additionally or alternatively operate according to the method 900. The method 900 begins with pairing the user device 106A-106D in the venue 104 with a three-dimensional model space of the lighting beam 300 and lighting fixture 102 (STEP 901). This step is accomplished, for instance, by directing the camera 110 such that the capture view of the camera scans at least one of the reference points 306. Once the reference points 306 have been scanned, the controller 200 can determine where the user device 106A-106D is in the venue 104 and what orientation it has in the venue 104 (e.g., as described above with respect to FIGS. 3 and 3A).

The method 900 also includes the controller 200 indicating a lighting beam destination 308 (STEP 902). The lighting beam destination 308 may be designated in, for instance, one of the ways described above. The lighting beam destination 308 is located relative to the capture view of the camera 110. Once the lighting beam destination 308 has been indicated, the method 900 includes the controller 200 converting the destination indicated by the user device 106 into coordinates at the venue 104 in the three-dimensional model space (STEP 903). This conversion is made based on the earlier gathered data about the orientation and position of the user device 106A-106D.

After this conversion has been made, the method 900 includes the controller 200 interpreting the coordinates at the venue 104 for the lighting beam destination 308 relative to lighting fixture arrangement (e.g., positions and orientations), and determining a corresponding lighting fixture 102 arrangement (e.g., using process 700 or process 800) that directs the lighting beam 300 appropriately to the lighting beam destination 308 (STEP 904). The method 900 then includes the controller 200 controlling actuation of at least one motor coupled to or associated with the lighting fixture 102 to move the lighting fixture 102 according to the determined lighting fixture 102 orientation such that the lighting beam 300 is directed to the lighting beam destination 308 (STEP 905).

Thus, embodiments described herein provide methods and systems for directing a lighting fixture in a venue. Various features and advantages of some embodiments are set forth in the following claims.

What is claimed is:

1. A method of directing a lighting fixture in a venue, the method comprising:
pairing a user device with a three-dimensional model space that represents a physical space of the venue;
indicating, with the user device, a lighting beam destination in the physical space of the venue using a position and an orientation of the user device in the physical space of the venue;
converting, with an electronic processor, the indicated lighting beam destination into coordinates in the three-dimensional model space;
determining, with the electronic processor, a lighting fixture orientation value to direct a lighting beam of the lighting fixture to the lighting beam destination in the physical space of the venue based on the coordinates of the lighting beam destination in the three-dimensional model space; and
controlling, with the electronic processor, actuation of a motor associated with the lighting fixture to move the lighting fixture to a lighting fixture orientation in the physical space of the venue based on the lighting fixture orientation value.

2. The method of claim 1, wherein the user device is associated with at least one camera, and
wherein indicating, with the user device, the lighting beam destination in the physical space of the venue using the position and orientation of the user device includes:
indicating the lighting beam destination relative to a capture view of the at least one camera.

3. The method of claim 1, wherein the user device is associated with at least one camera, and
wherein the pairing of the user device in the venue with the three-dimensional model space that represents the physical space of the venue includes:

using a capture view of the at least one camera to determine the position and the orientation of the user device.

4. The method of claim 2, wherein the pairing of the user device in the venue with the three-dimensional model space that represents the physical space of the venue includes:
detecting a reference point in the venue with the at least one camera associated with the user device.

5. The method of claim 2, wherein the user device displays an augmented reality image of the venue based on the capture view of the at least one camera.

6. The method of claim 5, wherein the indicating, with the user device, the lighting beam destination in the physical space of the venue using the position and the orientation of the user device includes:
designating a location on a surface of the venue where an area of the capture view of the camera meets the surface as the lighting beam destination.

7. The method of claim 6, wherein the controlling, with the electronic processor, actuation of the motor associated with the lighting fixture to move the lighting fixture to the lighting fixture orientation in the physical space of the venue based on the orientation values includes:
controlling, with the electronic processor, movement of the lighting fixture to follow the lighting beam destination as the capture view of the camera changes.

8. The method of claim 1, wherein the indicating, with the user device, the lighting beam destination in the physical space of the venue using the position and the orientation of the user device includes:
detecting, by the electronic processor, a pointing direction of an end of the user device in a lighting beam destination direction in the physical space while the user device is paired with the three-dimensional model space.

9. The method of claim 8, wherein at least one camera is associated with the user device such that a capture view of the camera faces a direction perpendicular to the pointing direction of the end of the user device.

10. The method of claim 9, wherein the controlling, with the electronic processor, actuation of the motor associated with the lighting fixture to move the lighting fixture to the corresponding lighting fixture orientation includes:
controlling, with the electronic processor, movement of the lighting fixture to follow the lighting beam destination as the capture view of the camera changes.

11. The method of claim 1, wherein the lighting beam destination in the physical space of the venue is designated by receiving, by the electronic processor, a distance and the orientation from the user device.

12. A system comprising:
a lighting fixture;
a motor associated with the lighting fixture;
a user device including a controller, the controller including an electronic processor and a memory, the memory storing instructions that when executed by the electronic processor configure the controller to:
pair the user device with a three-dimensional model space of a venue that represents a physical space of the venue,
indicate a lighting beam destination in the physical space of the venue using a position and an orientation of the user device in the physical space of the venue,
convert the indicated lighting beam destination into coordinates in the three-dimensional model space based on the position and orientation of the user device in the physical space of the venue,
determine a lighting fixture orientation value to direct a lighting beam of the lighting fixture to the lighting beam destination in the physical space of the venue based on the coordinates of the lighting beam destination in the three-dimensional model space; and
control actuation of the motor associated with the lighting fixture to move the lighting fixture to a lighting fixture orientation in the physical space of the venue based on the lighting fixture orientation value.

13. The system of claim 12, further comprising at least one camera associated with the electronic processor, wherein the controller is further configured to use a capture view of the at least one camera to determine the position and the orientation of the user device.

14. The system of claim 12, further comprising at least one camera associated with the electronic processor, wherein the controller is further configured to indicate the lighting beam destination relative to a capture view of the at least one camera.

15. The system of claim 14, wherein the controller is further configured to detect a reference point in the venue with the at least one camera associated with the electronic processor.

16. The system of claim 14, wherein the user device displays an augmented reality image of the venue based on the capture view of the at least one camera.

17. The system of claim 16, wherein the controller is further configured to designate a location on a surface of the venue where a point or area of the capture view of the camera meets the surface as the lighting beam destination.

18. The system of claim 12, wherein the controller is further configured to control movement of the lighting fixture to follow the lighting beam destination as the capture view of the camera changes.

19. The system of claim 12, wherein the controller is further configured to detect a pointing direction of an end of the user device in a lighting beam destination direction in the physical space while the user device is paired with the three-dimensional model space.

20. The system of claim 19, wherein at least one camera is associated with the user device such that a capture view of the camera faces a direction perpendicular to the pointing direction of the end of the user device.

21. The system of claim 20, wherein the controller is further configured to control movement of the lighting fixture to follow the lighting beam destination as the capture view of the camera changes.

22. The system of claim 12, wherein the lighting beam destination in the physical space of the venue is designated by receiving a distance and the orientation from the user device.

* * * * *